United States Patent
Zheng et al.

(10) Patent No.: US 6,734,082 B2
(45) Date of Patent: May 11, 2004

(54) METHOD OF FORMING A SHALLOW TRENCH ISOLATION STRUCTURE FEATURING A GROUP OF INSULATOR LINER LAYERS LOCATED ON THE SURFACES OF A SHALLOW TRENCH SHAPE

(75) Inventors: Jia Zhen Zheng, Singapore (SG); Soh Yun Siah, Singapore (SG); Chew Hoe Ang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/213,173

(22) Filed: Aug. 6, 2002

(65) Prior Publication Data

US 2004/0029353 A1 Feb. 12, 2004

(51) Int. Cl.$^7$ ................................... H01L 21/46
(52) U.S. Cl. ................ 438/435; 438/424; 438/436; 438/437
(58) Field of Search ................ 438/435, 436, 438/437

(56) References Cited

U.S. PATENT DOCUMENTS

| | | | |
|---|---|---|---|
| 5,763,315 A | 6/1998 | Benedict et al. | 438/424 |
| 6,037,018 A | 3/2000 | Jang et al. | 427/579 |
| 6,271,153 B1 * | 8/2001 | Moore | |
| 6,319,794 B1 | 11/2001 | Akatsu et al. | 438/424 |
| 6,323,106 B1 | 11/2001 | Huang et al. | 438/433 |
| 6,331,469 B1 * | 12/2001 | Park et al. | 438/296 |
| 6,350,662 B1 | 2/2002 | Thei et al. | 438/435 |
| 6,391,738 B2 * | 5/2002 | Moore | |
| 6,461,937 B1 * | 10/2002 | Kim et al. | |
| 6,524,930 B1 * | 2/2003 | Wasshuler et al. | |
| 2002/0070430 A1 * | 6/2002 | Oh et al. | |

* cited by examiner

Primary Examiner—Long Pham
(74) Attorney, Agent, or Firm—George O. Saile; Rosemary L. S. Pike

(57) ABSTRACT

A process for forming a shallow trench isolation (STI), structure in a semiconductor substrate, featuring a group of insulator liner layers located on the surfaces of the shallow trench shape used to accommodate the STI structure, has been developed. After defining a shallow trench shape featuring rounded corners, a group of thin insulator liner layers, each comprised of either silicon oxide or silicon nitride, is deposited on the exposed surfaces of the shallow trench shape via atomic layer depositing (ALD), procedures. A high density plasma procedure is used for deposition of silicon oxide, filling the shallow trench shape which is lined with the group of thin insulator liner layers. The silicon nitride component of the insulator liner layers, prevents diffusion or segregation of P type dopants from an adjacent P well region to the silicon oxide of the STI structure.

28 Claims, 4 Drawing Sheets

METHOD OF FORMING A SHALLOW TRENCH ISOLATION STRUCTURE FEATURING A GROUP OF INSULATOR LINER LAYERS LOCATED ON THE SURFACES OF A SHALLOW TRENCH SHAPE

BACKGROUND OF THE INVENTION

1. Field of the Invention

The present invention relates to methods used to fabricate semiconductor devices, and more specifically to a method used to fabricate a shallow trench isolation (STI), structure featuring a group of silicon oxide and silicon nitride insulator liners on the sides of the shallow trench shape used to accommodate the STI structure.

2. Description of Prior Art

The ongoing quest for to form smaller semiconductor chips, still providing device densities equal or greater than device densities found with larger semiconductor chips, necessitated the use of new device isolation structures, structures that would consume less area than previously used isolation regions, formed via local oxidation of silicon (LOCOS), procedures. The presence of birds beak, or oxide encroachment into regions reserved for active device regions, encountered when applying LOCOS isolation procedures, resulted in the semiconductor industry shifting to STI structures, wherein the procedure for forming the STI structures does not consume adjacent active device area. The formation of STI structures however present a different set of process concerns that if not addressed can deleteriously influence device yield and performance. For example wet etch procedures encountered during routine device fabrication procedures can result in removal of a top portion of an insulator liner layer resulting in a gap or a divot located between the STI structure and the adjacent active device region. The unwanted divot can trap unwanted materials or create an area where conductive bridging can occur, in both cases adversely influencing device yield and parametrics. In addition when the active device region is comprised with a P well region, provided for accommodation of N channel, metal oxide semiconductor (NMOS), devices, segregation of the P type dopants in the well region, into undoped insulator liner layers or into an undoped insulator fill of the STI structure, can occur during high temperature process steps such as source/drain anneal procedures. The depletion of dopant in the P well region can result in unacceptable parametrics such as low threshold voltages, specifically for narrow width devices.

This invention will describe a process for fabricating a STI structure in which multiple composite insulator liner layers are used on the exposed surfaces, the sides and bottom of a shallow trench shape, to alleviate formation of the unwanted divot or gap in the insulator liner layer, located at the STI-active device region interface, in addition to preventing segregation of dopants from a active device region to components of the STI structure. Prior art such as Thei et al, in U.S. Pat. No. 6,350,662 B1, Jang et al, in U.S. Pat. No. 6,037,018, Huang et al, in U.S. Pat. No. 6,323,106 B1, and Akatsu et al, in U.S. Pat. No. 6,319,794 B1, describe methods of forming STI structures with various insulator, and composite insulator liner layers, located on the sides of shallow trench shapes. However none of these prior arts describe the formation of a group of insulator liner layers located on the exposed surfaces of the shallow trench shape, offering increased protection against unwanted divot formation, and against dopant depletion specifically occurring at the edge of the active device region located adjacent to the STI structure.

SUMMARY OF THE INVENTION

It is an object of this invention to form a shallow trench isolation (STI), structure for metal oxide semiconductor field effect (MOSFET), devices.

It is another object of this invention to form a shallow trench shape in a top portion of a semiconductor substrate, with the bottom of the shallow trench shape exhibiting rounded corners.

It is still another object of this invention to form a group of insulator liner layers, each comprised of either silicon nitride or silicon oxide, on the sides and bottom of a shallow trench shape.

In accordance with the present invention a method of forming an STI structure in a top portion of a semiconductor substrate, featuring a group of insulator liner layers located on the surfaces of a shallow trench shape, is described. A well region is formed in a top portion of a semiconductor substrate, followed by formation of a masking composite insulator layer comprised of an underlying pad silicon dioxide layer and an overlying silicon nitride layer. A shallow trench shape is defined in the composite insulator layer and in a top portion of the well region. Thermal growth of, followed by removal of, a silicon dioxide layer results in rounded corners at the bottom of the shallow trench shape. Atomic layer deposition procedures are used to deposit a group of insulator layers, comprised of a first silicon oxide layer, a first silicon nitride layer, a second silicon oxide layer, and a second silicon nitride layer, on the surfaces of the shallow trench shape, as well as on the top surface of the masking composite insulator layer. After filling of the shallow trench shape with a high density plasma (HDP), deposited silicon oxide layer, chemical mechanical polishing (CMP), procedures are used to selectively remove the portions of HDP silicon oxide layer from the top surface of the masking composite insulator layer resulting in the STI structure, lined with the multiple insulator liner layers. A high temperature anneal is followed by removal of the portions of the group of insulator liner layers, and of the masking composite insulator layer, located on the top surface of the semiconductor surface, exposing the subsequent active device regions, located adjacent of the STI structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
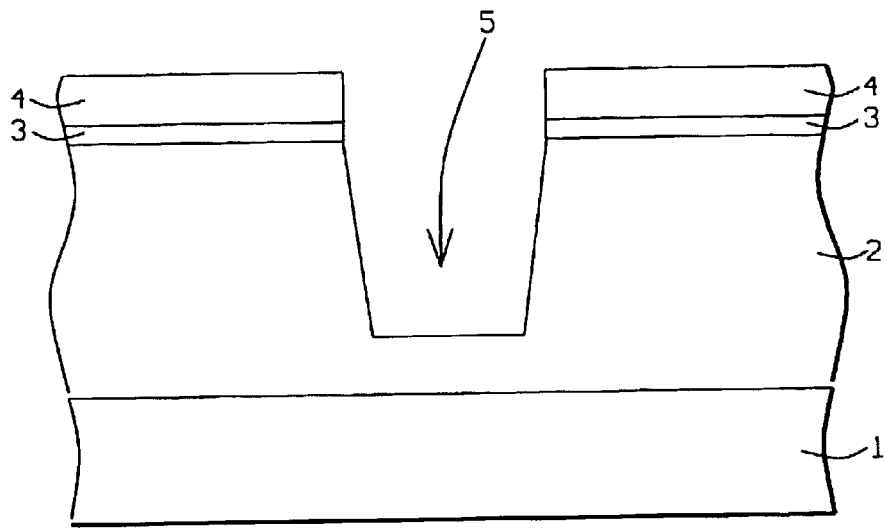
FIGS. 1–7, which schematically in cross-sectional style, show key stages used to form an STI structure featuring a group of insulator liner layers located on the surfaces of the shallow trench shape used to accommodate the STI structure.

The method of fabricating an STI structure in a top portion of a semiconductor substrate featuring a group of insulator liner layers located on the surfaces the shallow trench shape used to accommodate the STI structure, will now be described in detail. Semiconductor substrate 1, comprised of P type, single crystalline silicon, featuring a <100> crystallographic orientation is used and schematically shown in FIG. 1. To accommodate NMOS devices the P type dopant level in a top portion of the semiconductor substrate has to be increased to allow the desired device parameters to be obtained. This is accomplished via formation of P well region 2, only in regions of semiconductor substrate 1, to be used for NMOS devices. Other regions of semiconductor substrate 1, to be used to accommodate P channel, or PMOS devices, will be subjected to procedures used to form N well regions in P type, semiconductor substrate 1. The formation of N well regions is not described in this application. P well region 2, is formed via implantation of boron or $BF_2$ ions, at an energy between about 100 to 500 KeV, at a dose between about 1E12 to 1E13 atoms/$cm^2$. After removal of a photo resist shape, not shown in the drawings, used to prevent boron implantation into regions designed for PMOS devices, an anneal procedure is employed to activate the boron or $BF_2$ ions resulting in P well region 2, shown schematically in FIG. 1, featuring a P type concentration greater than the P type concentration of semiconductor substrate 1.

Pad oxide layer 3, comprised of silicon dioxide layer 3, is next formed at a thickness between about 50 to 200 Angstroms, via a thermal oxidation procedure performed at a temperature between about 800 to 1200° C., in an oxygen steam ambient. Silicon nitride layer 4, is deposited at a thickness between about 1000 to 3000 Angstroms, via use of a low pressure chemical vapor deposition (LPCVD), or via use of a plasma enhanced chemical vapor deposition (PECVD), procedure. A photo resist shape, not shown in the drawings is used as an etch mask, allowing a reactive ion etching (RIE), procedure to define shallow trench opening 5, in silicon nitride layer 4, in pad oxide layer 3, and in a top portion of P well region 2, to a depth between about 3000 to 5000 Angstroms. The RIE procedure is performed using $Cl_2$ as an etchant for silicon nitride, $CHF_3$ as an etchant for silicon dioxide, while $Cl_2$ or $SF_6$ is used as an etchant for silicon. The tapered sides of shallow trench shape 5, between about 75 to 90°, are intentionally formed to reduce the complexity for subsequent filling of the shallow trench shape with deposited insulator layer. The photo resist shape used for definition of shallow trench shape 5, is removed via plasma oxygen ashing procedures. The result of these procedures is schematically shown in FIG. 1.

Figure 2:
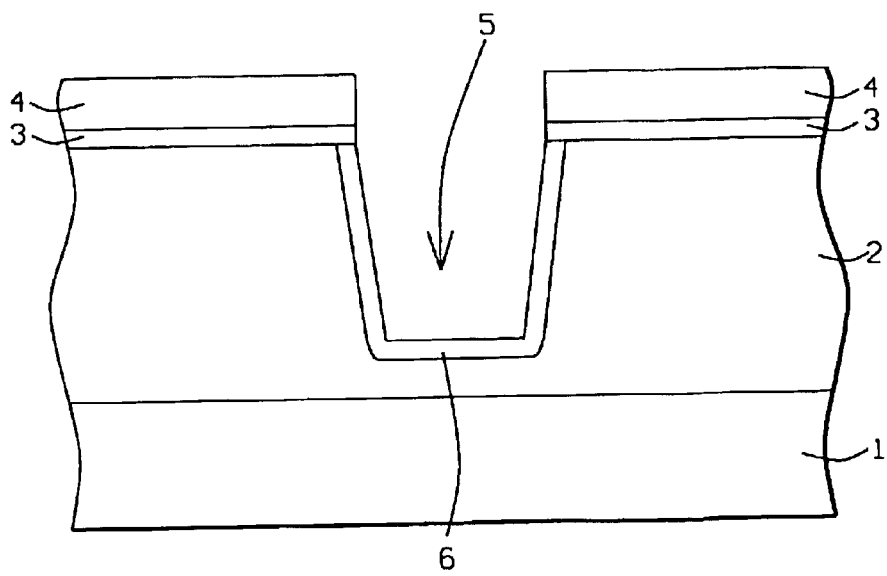
Figure 3:
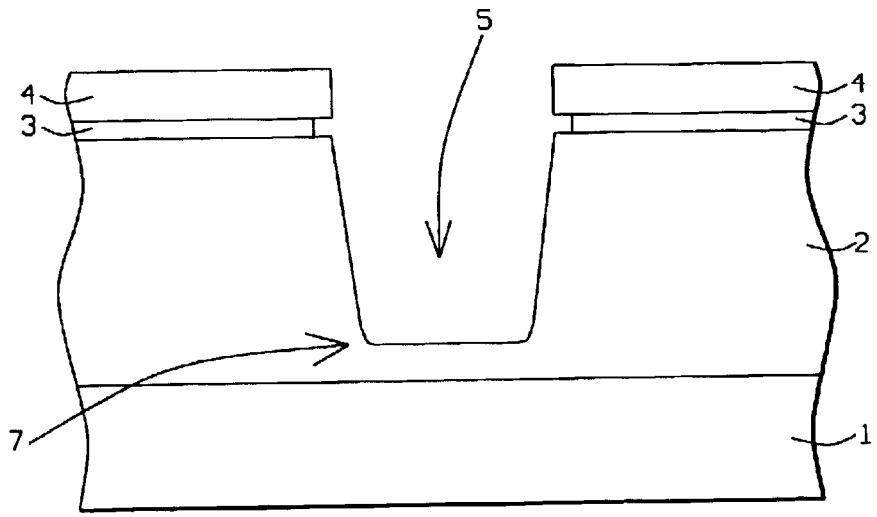

To avoid isolation leakage resulting from sharp corners at the bottom of shallow trench shape 5, a corner rounding procedure is performed. Silicon dioxide layer 6, is first formed via thermal growth at a temperature between about 800 to 1200° C., in an oxygen—steam ambient. This is schematically shown in FIG. 2. Silicon dioxide layer 6, thermally grown to a thickness between about 50 to 200 Angstroms, is then removed via use of a dilute hydrofluoric (DHF), solution, resulting in the bottom of shallow trench shape 5, now featuring rounded corners 7, as the result of the oxidation and removal procedure. The isotropic wet etch removal of the silicon dioxide layer however results in lateral removal of pad oxide layer 3, shown as an undercut region in FIG. 3. In addition to creating rounded corners at the bottom of shallow trench shape 5, the high temperature oxidation procedure also repairs regions of semiconductor substrate 1, damaged as a result of the RIE procedure used for definition of shallow trench shape 5.

Figure 4:
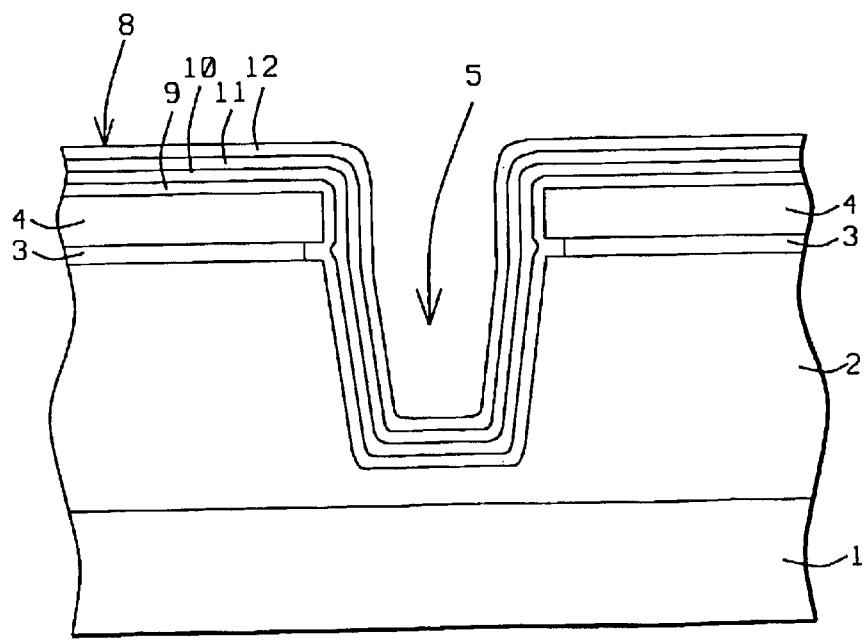

A group of insulator layers 8, featuring two identical composite insulator layers, each comprised of an underlying silicon oxide layer and an overlying silicon nitride layer, are next obtained via atomic layer deposition (ALD), procedures, and shown schematically in FIG. 4. A first, or underlying composite insulator liner layer is first deposited, comprised of underlying silicon oxide liner component 9, at a thickness between about 5 to 10 Angstroms, and overlying silicon nitride liner component 10, also deposited at a thickness between about 5 to 10 Angstroms. The ALD procedure is performed at a temperature between about 25 to 400° C., using silane and nitrous oxide as reactants for the silicon oxide liner component, while silane and ammonia are used for deposition of the silicon nitride liner. A second, or overlying composite insulator liner layer, comprised of underlying silicon oxide liner 11, again at a thickness between about 5 to 10 Angstroms, and overlying silicon nitride liner 12, again deposited at a thickness between about 5 to 10 Angstroms, is next deposited. The ALD procedure used for the second composite insulator liner layer is performed using the same temperature, and using the same reactants, as used previously for the ALD procedure employed for deposition of the first composite insulator liner layer. This is schematically shown in FIG. 4. The lateral undercut in pad oxide layer 3, is filled by group of insulator liner layers 8. This is schematically shown in FIG. 4.

Figure 5:
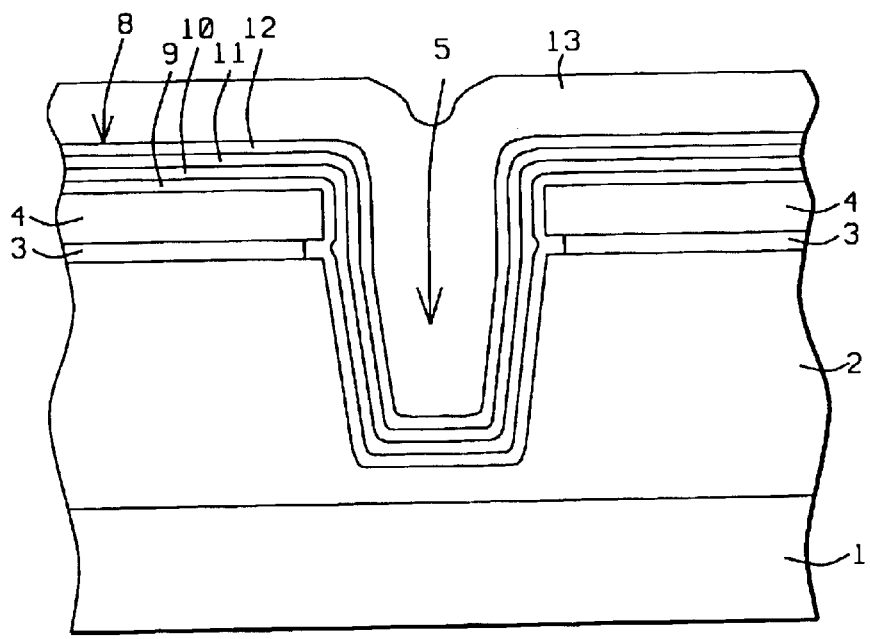
Figure 6:
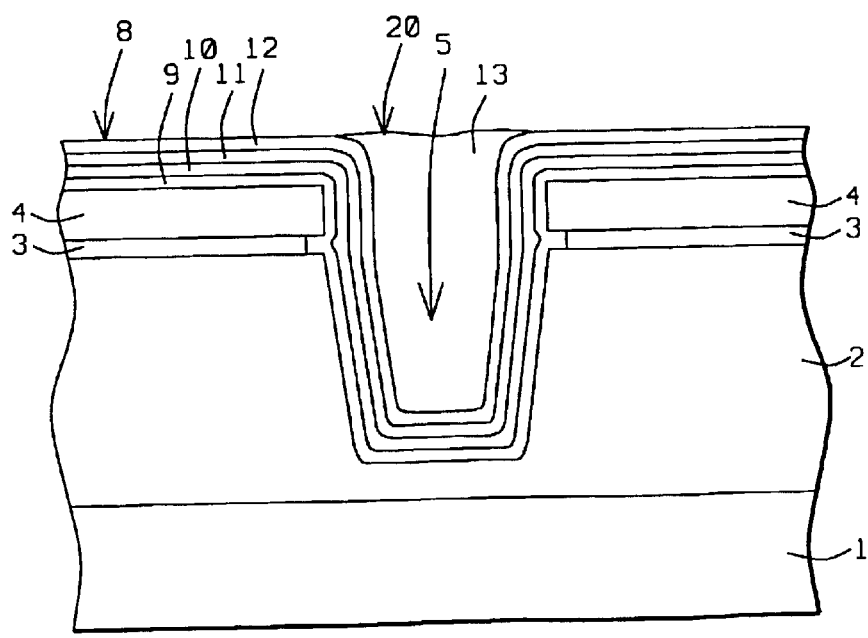

A high density plasma (HDP), procedure is next used to deposit HDP silicon oxide layer 13, completely filling shallow trench shape 5, with deposition of HDP silicon oxide layer also present on the top surface of the composite insulator layers in regions of semiconductor substrate 1, not occupied by shallow trench shape 5. This is schematically shown in FIG. 5. HDP silicon oxide layer 13, is deposited at a thickness between about 5000 to 8000 Angstroms, using silane ($SiH_4$), and oxygen as reactants. Removal of unwanted portions of HDP silicon oxide layer 5, from the top surface of the composite insulator layer, or planarization of the subsequent STI structure, is next accomplished via a CMP procedure, with the selective CMP procedure terminating at the top surface of silicon nitride layer 12. If desired unwanted portions of HDP silicon oxide layer 13, can be removed via a RIE procedure using $CHF_3$ as a selective etchant for silicon oxide, with the RIE procedure terminating at the appearance of silicon nitride layer 12. The result of the planarization procedure is the definition of STI structure 20, in shallow trench shape 5, schematically shown in FIG. 6, comprised of HDP silicon oxide layer 13, and encased by the group of insulator liner layers. The presence of the group of insulator layers, or the multiple composite insulator liner layers, fill the undercut region, as well as preventing boron diffusion or segregation from the P well region into silicon oxide layer 13, of STI structure 20. The silicon nitride components of the composite insulator liner layers block boron diffusion, thus eliminating boron depletion at the edges of the P well region, and thus allow the proper level of P type dopant to be maintained, allowing the desired device threshold voltage to be realized. A post-planarization anneal procedure, performed at a temperature between about 800 to 1200° C., in an inert ambient, can be employed to allow any gaps in shallow trench shape 5, to be filled by annealed, silicon oxide layer 13.

Figure 7:
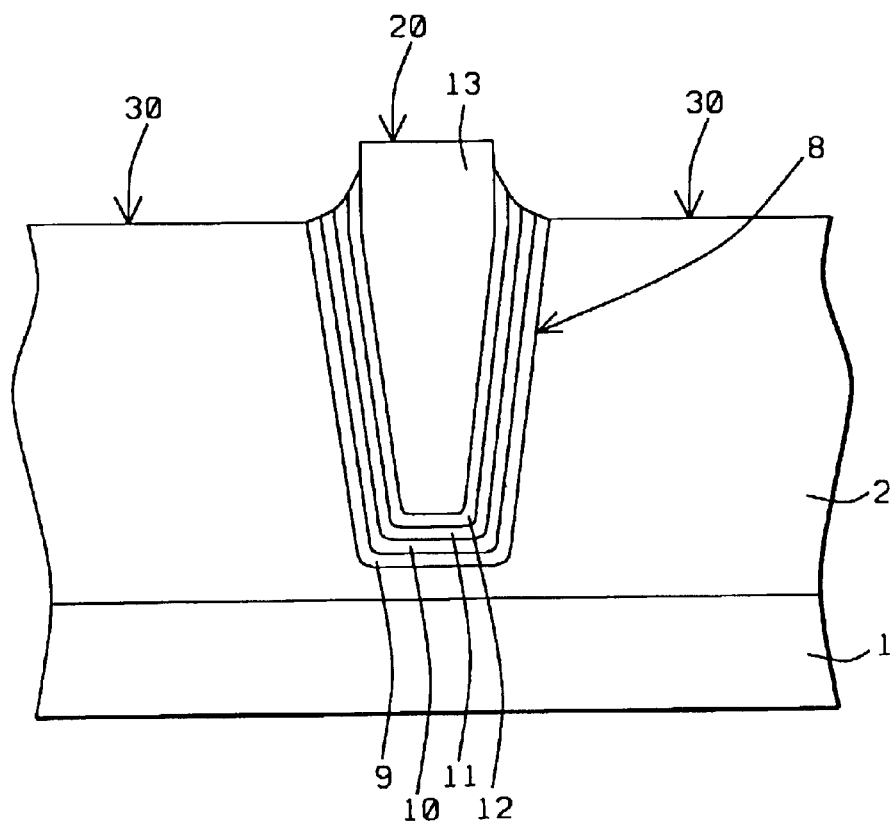

Removal of insulator layer liner group 8, as well as removal of silicon nitride layer 4, and pad silicon dioxide layer 3, exposing the top surface of active device regions 30, is next addressed and schematically shown in FIG. 7. A RIE procedure using $Cl_2$ for silicon nitride layers and using $CHF_3$ for silicon oxide layers can be employed, or if desired wet etch procedures using hot phosphoric acid can be used as an etchant for silicon nitride while a dilute, or buffered hydrofluoric acid can be used as the etchant for the silicon oxide layers.

While this invention has been particularly shown and described with reference to the preferred embodiments thereof, it will be understood by those skilled in the art that various changes in form and details may be made without departing from the spirit or scope of the invention.

What is claimed is:

1. A method of forming a shallow trench isolation (STI), structure in a semiconductor substrate, comprising the steps of:

forming a shallow trench shape in a composite insulator layer and in an underlying, top portion of said semiconductor substrate;

forming rounded corners in said semiconductor substrate at the bottom of said shallow trench shape;

forming a group of insulator liner layers on the surfaces of said shallow trench shape;

forming an insulator shape in said shallow trench shape resulting in an insulator filled STI structure;

removing portions of said group of insulator liner layers, and removing said composite insulator layer, from top surface of portions of said semiconductor substrate not occupied by said insulator filled STI structure; and performing an anneal procedure at a temperature between about 800 to 1100° C.

2. The method of claim 1, wherein the top portion of said semiconductor substrate is P well region, comprised with P type dopants.

3. The method of claim 1, wherein said composite insulator layer is comprised of an underlying pad silicon dioxide layer at a thickness between about 50 to 200 Angstroms, and an overlying silicon nitride layer at a thickness between about 1000 to 3000 Angstroms.

4. The method of claim 1, wherein said shallow trench shape is formed in the top portion of said semiconductor substrate via a reactive ion etching (RIE), procedure, using $Cl_2$ or $SF_6$ as an etchant for the semiconductor material.

5. The method of claim 1, wherein the depth of said shallow trench shape in the top portion of said semiconductor substrate, is between about 3000 to 5000 Angstroms.

6. The method of claim 1, wherein the sides of said shallow trench shape are formed with a taper between about 75 to 90° with reference to the horizontal top surface of said shallow trench shape.

7. The method of claim 1, wherein said rounded corners, located at the bottom of said shallow trench shape, are formed via thermal growth of a silicon dioxide layer on the exposed surfaces of said shallow trench shape at a thickness between about 50 to 200 Angstroms, via a thermal oxidation procedure performed at a temperature between about 800 to 1200° C. in an oxygen—steam ambient, followed by removal of the thermally grown silicon dioxide layer using dilute hydrofluoric acid as an etchant.

8. The method of claim 1, wherein said group of insulator liner layers is comprised of an underlying, first composite insulator layer, and an overlying, second composite insulator layer.

9. The method of claim 1, wherein said group of insulator liner layers is obtained via atomic layer deposition (ALD), procedures, performed at a temperature between about 25 to 400° C.

10. The method of claim 8, wherein said underlying, first composite insulator layer is comprised with an underlying, silicon oxide layer grown to a thickness between about 5 to 10 Angstroms, using silane and nitrous oxide as reactants.

11. The method of claim 8, wherein said underlying, first composite insulator layer is comprised with an overlying, silicon nitride layer grown to a thickness between about 5 to 10 Angstroms, using silane and ammonia as reactants.

12. The method of claim 8, wherein said overlying, second composite insulator layer is comprised with an underlying, silicon oxide layer grown to a thickness between about 5 to 10 Angstroms, using silane and nitrous oxide as reactants.

13. The method of claim 8, wherein said overlying, second composite insulator layer is comprised with an overlying, silicon nitride layer grown to a thickness between about 5 to 10 Angstroms, using silane and ammonia as reactants.

14. The method of claim 1, wherein said insulator shape located in said shallow trench shape, is comprised of silicon oxide, obtained via high density plasma (HDP), procedures, at a thickness between about 5000 to 8000 Angstroms.

15. The method of claim 1, wherein removal of said group of insulator liner layers from top surface of portions of said semiconductor substrate not occupied by said insulator filled STI structure, is accomplished via a chemical mechanical polishing (CMP), procedure.

16. A method of forming a shallow trench isolation (STI), structure in a semiconductor substrate, featuring a group of insulator liner layers located on the surfaces of a shallow trench shape that is used to accommodate the STI structure, comprising the steps of:

forming a well region in a top portion of said semiconductor substrate;

forming a composite insulator layer on said semiconductor substrate, comprised of an underlying, first silicon dioxide layer and an overlying, first silicon nitride layer;

forming an shallow trench shape in a composite insulator layer and in a top portion of said well region;

growing a second silicon dioxide layer on the exposed surfaces of said shallow trench shape;

removing said second silicon dioxide layer resulting in rounded corners at the bottom of said shallow trench shape;

depositing said group of insulator liner layers on exposed surfaces of said shallow trench shape, with said group of insulator layers comprised of an underlying, first silicon oxide layer, a second silicon nitride layer, a second silicon oxide layer, and an overlying, third silicon nitride layer;

depositing a third silicon oxide layer completely filling said shallow trench shape;

performing a planarization procedure resulting in an insulator filled, STI structure in said shallow trench shape;

performing a post-planarization anneal procedure at a temperature between about 800 to 1000° C.; and removing portions of said group of insulator liner layers, and removing said composite insulator layer, from top surface of portions of said semiconductor substrate not occupied by said insulator filled STI structure.

17. The method of claim 16, wherein said well region is a P well region, formed in a top portion of said semiconductor substrate via implantation of boron or $BF_2$ ions, at an energy between about 100 to 500 KeV, and at a dose between about 1E12 to 1E13 atoms/cm².

18. The method of claim 16, wherein said shallow trench shape is formed in the top portion of said well region via a reactive ion etching (RIE), procedure, using $Cl_2$ or $SF_6$ as an etchant for the semiconductor material.

19. The method of claim 16, wherein the depth of said shallow trench shape, in the top portion of said well region, is between about 3000 to 5000 Angstroms.

20. The method of claim 16, wherein the sides of said shallow trench shape are formed with a taper between about 75 to 90°, with reference to a horizontal top surface of said shallow trench shape.

21. The method of claim 16, wherein said second silicon dioxide layer is obtained at a thickness between about 50 to 200 Angstroms, via a thermal oxidation procedure performed at a temperature between about 800 to 1200° C., in an oxygen—steam ambient.

22. The method of claim 16, wherein said second silicon dioxide layer is removed via a wet etch procedure using dilute hydrofluoric acid.

23. The method of claim 16, wherein said first silicon oxide layer of said group of insulator liner layers, is obtained at a thickness between about 5 to 10 Angstroms, via atomic layer deposition (ALD), procedures, performed at a temperature between about 25 to 400° C., using silane and nitrous oxide as reactants.

24. The method of claim 16, wherein said second silicon nitride layer of said group of insulator liner layers, is obtained at a thickness between about 5 to 10 Angstroms, via ALD procedures, performed at a temperature between about 25 to 400° C., using silane and ammonia as reactants.

25. The method of claim 16, wherein said second silicon oxide layer of said group of insulator liner layers, is obtained at a thickness between about 5 to 10 Angstroms, via ALD procedures, performed at a temperature between about 25 to 400° C., using silane and nitrous oxide as reactants.

26. The method of claim 16, wherein said third silicon nitride layer of said group of insulator liner layers, is obtained at a thickness between about 5 to 10 Angstroms, via ALD procedures, performed at a temperature between about 25 to 400° C., using silane and ammonia as reactants.

27. The method of claim 16, wherein said third silicon oxide layer, used to completely fill said shallow trench shape, is obtained at a thickness between about 5000 to 8000 Angstroms, via high density plasma (HDP), procedures.

28. The method of claim 16, wherein said planarization procedure is a chemical mechanical polishing procedure.

* * * * *